(12) United States Patent
Si et al.

(10) Patent No.: US 9,391,619 B2
(45) Date of Patent: Jul. 12, 2016

(54) LEVEL-SHIFT CIRCUITS COMPATIBLE WITH MULTIPLE SUPPLY VOLTAGE

(71) Applicant: VIA Alliance Semiconductor Co., Ltd., Shanghai (CN)

(72) Inventors: Qiang Si, Beijing (CN); Cheng Liu, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/326,747

(22) Filed: Jul. 9, 2014

(65) Prior Publication Data

US 2015/0102849 A1    Apr. 16, 2015

(30) Foreign Application Priority Data

Oct. 15, 2013    (CN) .......................... 2013 1 0481273

(51) Int. Cl.
*H03K 3/00*         (2006.01)
*H03K 19/0175*     (2006.01)

(52) U.S. Cl.
CPC .................................. *H03K 19/0175* (2013.01)

(58) Field of Classification Search
USPC .......................................................... 327/333
See application file for complete search history.

(56) References Cited

U.S. PATENT DOCUMENTS

| 7,348,800 B2 * | 3/2008 | Koto et al. ....................... 326/80 |
| 7,675,322 B2 * | 3/2010 | Park ................. 326/81 |
| 8,179,160 B1 | 5/2012 | Chauhan et al. |

OTHER PUBLICATIONS

Shigematsu, S., et al.; "Low-Power High-Speed 1-V LSI Using a 0.25-um MTCMOS/SIMOX Technique;" In ASIC Conference 1998, Proceedings, Eleventh Annual IEEE International; pp. 103-107; Sep. 13-16, 1998.
Wang, C.C., et al.; "A 1/2 x VDD to 3 x VDD Bidirectional I/O Buffer with a Dynamic Gate Bias Generator;" in Circuits and Systems I: Regular Papers, IEEE Transactions on; vol. 57, No. 7; pp. 1642-1653; Jul. 2010.

* cited by examiner

*Primary Examiner* — Lincoln Donovan
*Assistant Examiner* — Patrick Chen
(74) *Attorney, Agent, or Firm* — McClure, Qualey & Rodack, LLP

(57) ABSTRACT

A level-shift circuit, receiving a supply voltage and a input signal, includes a pre-stage voltage conversion circuit and a post-stage voltage conversion circuit. The pre-stage voltage conversion circuit includes a first voltage protection module generating an inner conversion voltage and a first voltage conversion module converting the input signal into a pre-stage output signal according to the inner conversion voltage. The post-stage voltage conversion circuit includes a second voltage protection module generating a first inverse output signal, a first output signal, a second inverse output signal, and a second output signal. The transistors of the pre-stage voltage conversion circuit and the post-stage voltage conversion circuit have a punch-through voltage. The level-shift makes the stress of the transistors less than the punch-through voltage when the supply voltage is greater than the punch-through voltage, and remains the driving capability when being less than the punch-through voltage.

9 Claims, 4 Drawing Sheets

LEVEL-SHIFT CIRCUITS COMPATIBLE WITH MULTIPLE SUPPLY VOLTAGE

CROSS REFERENCE TO RELATED APPLICATIONS

This application claims priority of China Patent Application No. 201310481273.8, filed on Oct. 15, 2013, the entirety of which is incorporated by reference herein.

BACKGROUND OF THE INVENTION

1. Field of the Invention

The invention is related to a level-shift circuit operating with a supply voltage higher than the operation voltage of the transistors, and more specifically, related to a high-speed level-shift circuit compatible with multiple supply voltage.

2. Description of the Related Art

In integrated circuits, the supply voltage is reduced as low as possible for lowering power consumption, and the supply voltage is thus continually reduced in integrated circuits. On the other hand, conventional integrated circuits with high supply voltage have also been adopted. For this purpose, multiple supply voltages are ready in a single system for handover. When an integrated circuit with different supply voltages is coupled, the voltage level of a signal must be converted into the other level by a level-shift circuit. For example, in an integrated circuit, a 0.9V digital signal is converted into an output signal with 1.2V to 3.3V.

The most well-known level-shift circuit uses a CMOS level-shift circuit. However, each PMOS transistor and each NMOS transistor has a different punch-through voltage in a different manufacturing process. When coupled to another integrated circuit, the supply voltage is switched between two supply voltages, in which one of the supply voltages is higher than the punch-through voltage of each of the PMOS transistors and NMOS transistors. This is a huge challenge for the designer of a level-shift circuit.

For example, a level-shift circuit converting 0.9V into 3.3V is easily implemented in 40 nm or any larger dimension manufacturing process. However, the structure requires some transistors to withstand more than 3.3V, and the voltage-endurance of transistors is about 2.4V in 2.8 nm or other more advanced processes. In this case, when converting a 0.9V digital signal into a 3.3V output signal, the transistors would be punched-through due to a 3.3V supply voltage such that the conventional level-shift could not be adopted.

Therefore, we need a new type of level-shift circuit to conquer the problems described above, and we need a level-shift circuit design to implement a level-shift with a higher supply voltage than the punch-through voltage of transistors.

BRIEF SUMMARY OF THE INVENTION

For solving the above problems, the invention provides a level-shift circuit for multiple supply voltage applications. The level-shift circuit protects the transistors thereof from punching through when the supply voltage is greater than the punch-through voltage of the transistors, and provides high speed when the supply voltage is less than the punch-through voltage.

In one embodiment, a level-shift circuit receives a supply voltage and an input signal to generate a first inverse output signal, a first output signal, a second inverse output signal, and a second output signal. The level-shift circuit comprises a pre-stage voltage conversion circuit and a post-stage voltage conversion circuit. The pre-stage voltage conversion circuit comprises a first voltage protection module and a first voltage conversion module. The first voltage protection module is coupled to the supply voltage and generates an inner conversion voltage. The first voltage conversion module is coupled to the first voltage protection module, receives the input signal, and converts the input signal into a pre-stage output signal according to the inner conversion voltage. The post-stage voltage conversion circuit is coupled to the pre-stage voltage conversion circuit and comprises a second voltage protection module. The second voltage protection module generates a first inverse output signal, a first output signal, a second inverse output signal, and a second output signal. The pre-stage voltage conversion circuit and the post-stage voltage conversion circuit comprise a plurality of transistors with a punch-through voltage. The level-shift makes the stress of the transistors less than the punch-through voltage when the supply voltage is greater than the punch-through voltage. The level-shift circuit outputs the first inverse output signal, the first output signal, the second inverse output signal, and the second output signal without converting the voltage swing when the supply voltage is less than the punch-through voltage.

In an embodiment of the level-shift circuit, the post-stage voltage conversion further comprises an N-type input pair and a P-type cross-coupled pair. The N-type input pair comprises a plurality of first N-type transistors. Source terminals of the first N-type transistors are coupled to a ground. One of gate terminals of the first N-type transistors receives the pre-stage output signal and the other receives an inverse of the pre-stage output signal. One of drain terminals of the first N-type transistors receives the first inverse output signal and the other receives the first output signal. The P-type cross-coupled pair comprises a plurality of first P-type transistors. Source terminals of the first P-type transistors are coupled to the supply voltage. One of drain terminals of the first P-type transistors receives the second inverse output signal and the other receives the second output signal.

In an embodiment of the level-shift circuit, the second voltage protection module further comprises a first N-type transistor pair, a first P-type transistor pair, a third N-type transistor, and a fourth N-type transistor. The first N-type transistor pair comprises a plurality of second N-type transistors. Source terminals of the second N-type transistors respectively receive the first inverse output signal and the first output signal. Gate terminals of the second N-type transistors receive a first voltage conversion signal. The first P-type transistor pair comprises a plurality of second P-type transistors. One of source terminals of the second P-type transistors receives the second inverse output signal and the other receives the second output signal. Gate terminals of the second P-type transistors receive a second voltage conversion signal. Drain terminals of the second P-type transistors are respectively coupled to the drain terminals of the second N-type transistors. A source terminal of the third N-type transistor receives the first inverse output signal. A drain terminal of the third N-type transistor receives the second inverse output signal. A gate terminal of the third N-type transistor receives the second logic signal. A source terminal of the fourth N-type transistor receives the first output signal. A drain terminal of the fourth N-type transistor receives the second output signal. A gate terminal of the fourth N-type transistor receives the first logic signal.

In an embodiment of the level-shift circuit, the second voltage conversion signal is half of a first supply voltage when the supply voltage is the first supply voltage, and the second voltage conversion signal is a ground level when the supply voltage is a second supply voltage.

In an embodiment of the level-shift circuit, when the supply voltage is a first supply voltage, the first voltage conversion signal and the second voltage conversion signal are around half of the first supply voltage. When the supply voltage is a second supply voltage, the third N-type transistor and the fourth N-type transistor short the first N-type transistor pair and the first P-type transistor pair, according to the second logic signal and the first logic signal respectively, such that a voltage difference of the second inverse output signal and the second output signal is the second supply voltage. The first supply voltage is greater than the punch-through voltage and the second supply voltage is less than the punch-through voltage.

In an embodiment of the level-shift circuit, when the supply voltage is the first supply voltage, a variation range of the second output signal and the second inverse output signal is between the first supply voltage and half of the first supply voltage, and a variation range of the first output signal and the first inverse output signal is around half of the first supply voltage and a ground level.

In an embodiment of the level-shift circuit, the first voltage protection module comprises a fifth N-type transistor and a third P-type transistor. A source terminal of the fifth N-type transistor is coupled to the inner conversion voltage. A drain of the fifth N-type transistor is coupled to the supply voltage. A gate terminal of the fifth N-type transistor receives the first voltage conversion signal. A source terminal of the third P-type transistor is coupled to the supply voltage. A drain terminal of the third P-type transistor is coupled to the inner conversion voltage. A gate terminal of the third P-type transistor receives a voltage selection signal. When the supply voltage is the first supply voltage, the first voltage conversion signal is half of the first supply voltage, and the voltage selection signal is the first supply voltage. When the supply voltage is the second supply voltage, the first voltage conversion signal is the second supply voltage, and the voltage conversion signal is a ground level.

In an embodiment of the level-shift circuit, the first voltage conversion module comprises a sixth N-type transistor, a seventh N-type transistor, a fourth P-type transistor, a fifth P-type transistor, a sixth P-type transistor, and a seventh P-type transistor. A gate terminal of the sixth N-type transistor receives the input signal. A source terminal of the sixth N-type transistor is coupled to the ground. A drain terminal of the sixth N-type transistor is coupled to the inverse of the pre-stage output signal. A gate terminal of the seventh N-type transistor receives the inverse of the input signal. A source terminal of the seventh N-type transistor is coupled to the ground. A drain terminal of the seventh N-type transistor is coupled to the pre-stage output signal. A gate terminal of the fourth P-type transistor receives the input signal. A source terminal of the fourth P-type transistor is coupled to a first node. A drain terminal is coupled to the inverse of the pre-stage output signal. A gate terminal of the fifth P-type transistor receives the inverse of the input signal. A source terminal of the fifth P-type transistor is coupled to a second node. A drain terminal of the fifth P-type transistor receives the pre-stage output signal. A gate terminal of the sixth P-type transistor is coupled to the second node. A source terminal of the sixth P-type transistor is coupled to the inner conversion voltage. A drain terminal of the sixth P-type transistor is coupled to the first node. A gate terminal of the seventh P-type transistor is coupled to the first node. A source terminal of the seventh P-type transistor is coupled to the inner conversion voltage. A drain terminal of the seventh P-type transistor is coupled to the second node.

An embodiment of the level-shift circuit further comprises a logic module coupled to the pre-stage voltage conversion circuit and the post-stage voltage conversion circuit. The inner conversion voltage and the pre-stage output signal are applied to the logic module which generates a first logic signal and a second logic signal according to the pre-stage output signal. The first logic signal and the second logic signal are applied to the second voltage protection module.

In an embodiment of the level-shift circuit, when the supply voltage is the first supply voltage, the first logic signal generated by the logic module is the pre-stage output signal, and the second logic signal generated by the logic module is the inverse of the pre-stage output signal. When the supply voltage is the second supply voltage, the first logic signal and the second logic signal generated by the logic module are the second supply voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
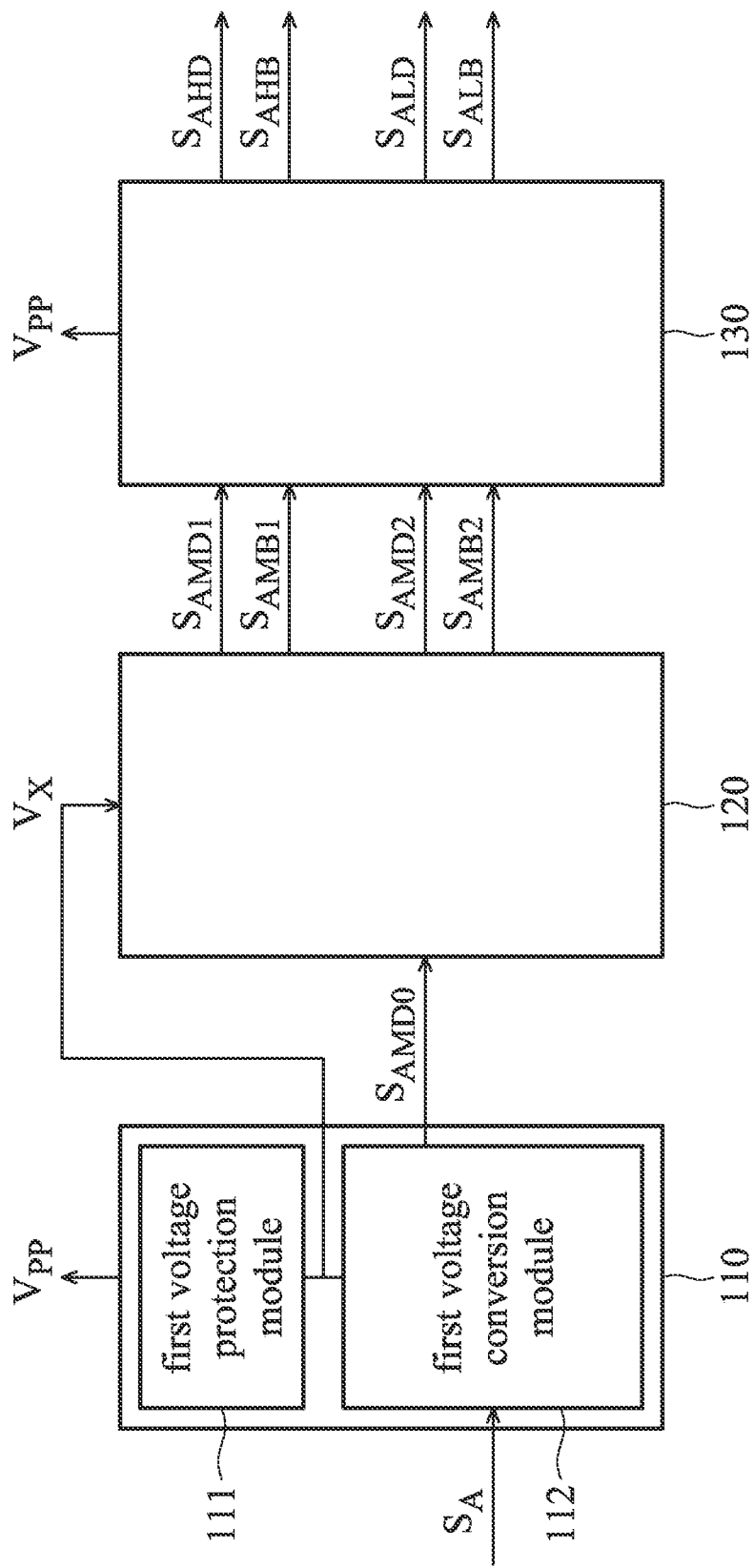
FIG. 1 is a block diagram of an embodiment of a voltage conversion circuit.

FIG. 1 is a block diagram of an embodiment of a level-shift circuit. As shown in FIG. 1, the level-shift circuit 100 includes the pre-stage voltage conversion circuit 110, the logic module 120, and the post-stage voltage conversion circuit 130. The pre-stage voltage conversion circuit 110 includes the first voltage protection module 111 and the first voltage conversion module 112. The first voltage protection module 111 receives the supply voltage $V_{PP}$ and converts the supply voltage $V_{PP}$ into the inner conversion voltage $V_X$ applied to the logic module 120. The first voltage conversion module 112 receives the input signal $S_A$ and converts the input signal $S_A$ into the high logic level, then the high logic level signal is output to the logic module 120 as the pre-stage output signal $S_{AMD0}$ of the inner conversion voltage $V_X$.

The logic module 120 receives the inner conversion voltage $V_X$ output by the pre-stage voltage conversion circuit 110, and generates the logic output signal $S_{AMD1}$, the logic inverse output signal $S_{AMB1}$, the first logic signal $S_{AMD2}$, and the second logic signal $S_{AMB2}$ according to the pre-stage output signal $S_{AMD0}$, in which the pre-stage output signal $S_{AMD0}$ is in-phase with the logic output signal $S_{AMD1}$, and the logic inverse output signal $S_{AMB1}$ is out-phase with the pre-stage output signal $S_{AMD0}$. The reasons will be described in detail in the following.

The post-stage voltage conversion circuit 130 generates the first output signal $S_{ALD}$, the first inverse output signal $S_{ALB}$, the second output signal $S_{AHD}$, and the second inverse output signal $S_{AHB}$, according to the logic output signal $S_{AMD1}$, the logic inverse output signal $S_{AMB1}$, the first logic signal $S_{AMD2}$, and the second logic signal $S_{AMB2}$ generated by the logic module 120.

Figure 2:
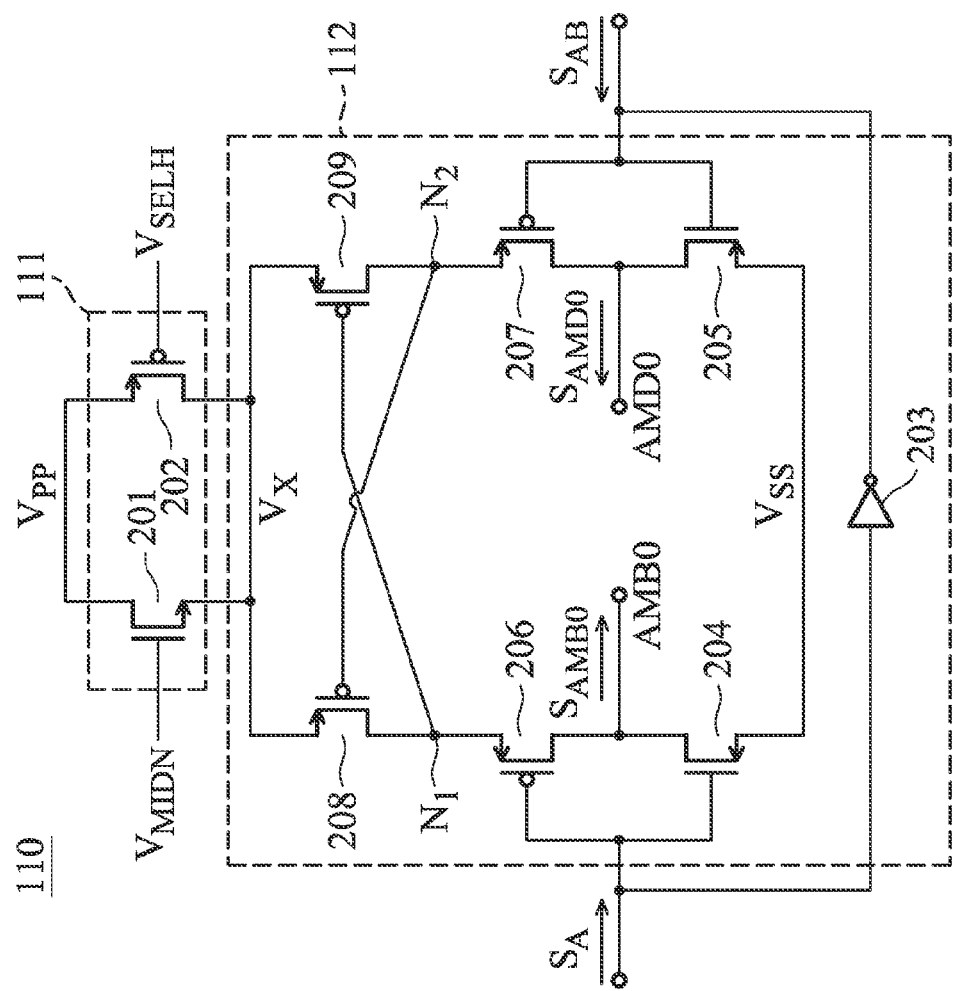
FIG. 2 is a schematic of an embodiment of a pre-stage voltage conversion circuit.

FIG. 2 is a schematic of an embodiment of a pre-stage voltage conversion circuit 110. As shown in FIG. 2, the pre-stage voltage conversion circuit 110 includes the first voltage protection module 111 and the first voltage conversion module 112. The first voltage protection module 111 includes the N-type transistor 201 and the P-type transistor 202. The gate terminal of the N-type transistor 201 is controlled by the first voltage conversion signal $V_{MIDN}$. The drain terminal of the N-type transistor 201 is coupled to the supply voltage $V_{PP}$. The source terminal of the N-type transistor 201 is coupled to the inner conversion voltage $V_X$. The gate terminal of the P-type transistor 202 is controlled by the voltage selection signal $V_{SELH}$. The source terminal of the P-type transistor 202 is coupled to the supply voltage $V_{PP}$. The drain terminal of the P-type transistor 202 is coupled to the inner conversion voltage $V_X$.

According to an embodiment of the invention, the supply voltage $V_{PP}$ is 1.8V or 3.3V. As mentioned above, in 28 nm or a more advanced process, the punch-through voltage of the transistors is 2.4V. When the supply voltage $V_{PP}$ is 3.3V, the first voltage conversion signal $V_{MIDN}$ is 1.65V, that is, half of the supply voltage $V_{PP}$, and the voltage selection signal $V_{SELH}$ is 3.3V, such that the N-type transistor 201 is turned ON and the P-type transistor 202 is turned OFF. Due to the characteristics of the N-type transistor 201 and the voltage of the gate terminal of the N-type transistor 201 being half of the supply voltage $V_{PP}$, it makes the inner conversion voltage $V_X$ equal to the threshold voltage of the N-type transistor 201 subtracted from a half of the supply voltage $V_{PP}$. According to an embodiment, the threshold voltage the N-type transistor 201 is 0.2V, the first voltage conversion signal $V_{MIDN}$ is 1.65V, and the inner conversion voltage $V_X$ is thus 1.45V.

When the supply voltage $V_{PP}$ is 1.8V, the first conversion signal $V_{MIDN}$ is 1.8V, but the voltage selection signal $V_{SELH}$ is 0V, it makes the N-type transistor 201 turn ON and the P-type transistor 202 turn ON. Due to the characteristics of the N-type and P-type transistors, the inner conversion voltage $V_X$ is 1.6V (the threshold voltage of the N-type transistor 201 is 0.2V) when only the N-type transistor 201 is turned ON, and the inner conversion voltage $V_X$ is increased to the voltage level of the supply voltage $V_{PP}$, i.e. 1.8V, when the P-type transistor 202 is also turned ON.

Therefore, the first voltage protection module 111 protects all the transistors of the pre-stage voltage conversion circuit 110 from damage due to sustaining a voltage higher than the punch-through voltage, and remains in a high operation speed when the supply voltage $V_{PP}$ is lower. That is, the first voltage protection module 111 limits the inner conversion voltage $V_X$ to 1.45V when the supply voltage $V_{PP}$ is 3.3V, and the first voltage protection module 111 also lets the supply voltage $V_{PP}$ through for remaining of the highest operation speed when the supply voltage $V_{PP}$ is 1.8V. The reasons for this will be described in detail in the following.

As shown in FIG. 2, the first voltage conversion module 112 is coupled to the first voltage protection module 111. The first voltage conversion module 112 receives the inner conversion voltage $V_X$, the input signal $S_A$, and the inverse input signal $S_{AB}$ and outputs the pre-stage inverse output signal $S_{AMB0}$ and the pre-stage output signal $S_{AMD0}$. The first voltage conversion module 112 includes the first inverter 203, the first pre-stage N-type transistor 204, the second pre-stage N-type transistor 205, the first pre-stage P-type transistor 206, the second pre-stage P-type transistor 207, the third pre-stage P-type transistor 208, and the fourth pre-stage P-type transistor 209. The gate terminal of the first pre-stage N-type transistor 204 receives the input signal $S_A$, the source terminal of the first pre-stage N-type transistor 204 is coupled to the ground $V_{SS}$, and the drain of the first pre-stage N-type transistor 204 is coupled to the pre-stage inverse output terminal AMB0 and outputs the pre-stage inverse output signal $S_{AMB0}$. The gate terminal of the second pre-stage N-type transistor 205 receives the inverse input signal $S_{AB}$. The source of the second pre-stage N-type transistor 205 is coupled to the ground $V_{SS}$. The drain of the second pre-stage N-type transistor 205 is coupled to the pre-stage output terminal AMD0 outputting the pre-stage output signal $S_{AMD0}$, in which the inverse input signal $S_{AB}$, passing through the first inverter 203, is out-phase with the input signal $S_A$. The gate terminal of the first pre-stage P-type transistor 206 receives the input signal $S_A$, the source terminal of the first pre-stage P-type transistor 206 is coupled to the pre-stage first node $N_1$, and the drain of the first pre-stage P-type transistor 206 is coupled to the pre-stage inverse output terminal AMB0. The gate terminal of the second pre-stage P-type transistor 207 receives the inverse input signal $S_{AB}$, the source of the second pre-stage P-type transistor 207 is coupled to the pre-stage second node $N_2$, and the drain of the second pre-stage P-type transistor 207 is coupled to the pre-stage output terminal AMD0. The gate terminal of the third pre-stage P-type transistor 208 is coupled to the pre-stage second node $N_2$, the source terminal of the third pre-stage P-type transistor 208 is coupled to the inner conversion voltage $V_X$, and the drain terminal of the third pre-stage P-type transistor 208 is coupled to the pre-stage first node $N_1$. The gate terminal of the fourth pre-stage P-type transistor 209 is coupled to the pre-stage first node $N_1$, the source terminal of the fourth pre-stage P-type transistor 209 is coupled to the inner conversion voltage $V_X$, and the drain terminal of the fourth pre-stage P-type transistor 209 is coupled to the pre-stage second node $N_2$.

For the convenience of explanation, according to an embodiment of the invention, the high logic level and the low logic level of the input signal $S_A$ and the inverse input signal $S_{AB}$ are respectively 0.9V and 0V, such that the supply voltage of the first inverter 203 is also 0.9V. According to another embodiment of the invention, the first voltage conversion module 112 can also directly receive the input signal $S_A$ and the inverse input signal $S_{AB}$ without the first inverter 203. According to another embodiment of the invention, the first pre-stage N-type transistor 204, the second pre-stage N-type transistor 205, the third pre-stage P-type transistor 208, and the fourth pre-stage P-type transistor 209 of the first voltage conversion module 112 can convert the input signal $S_A$ and the inverse input signal $S_{AB}$ into the pre-stage inverse output signal $S_{AMB0}$ and the pre-stage output signal $S_{AMD0}$ with voltage reduction and accomplish the function of a voltage conversion circuit, without considering the first pre-stage P-type transistor 206 and the second pre-stage P-type transistor 207. However, such a voltage conversion circuit results in an increased width-to-length ratio (i.e. W/L) of the first pre-stage N-type transistor 204 and the second pre-stage N-type transistor 205. The purpose of the first pre-stage P-type transistor 206 and the second pre-stage P-type transistor 207 is to reduce the width-to-length ratio (i.e. W/L) of the first pre-stage N-type transistor 204 and the second pre-stage N-type transistor 205. In addition, in a process corner, that is, the N-type transistor is slow and the P-type transistor is fast, or at −40° C., when the input signal $S_A$ converted from the low logic level to the high logic level, according to an embodiment of the invention, that is from 0V to 0.9V, the first pre-stage N-type transistor 204 and the second pre-stage N-type transistor 205 must be extremely large to convert the pre-stage inverse output signal $S_{AMB0}$ from the high logic level to the low logic level, because of the drive capability of the N-type transistor is lower than that of the P-type transistor. According to an embodiment of the invention, the pre-stage inverse output signal $S_{AMB0}$ is converted from 1.45V to 0V when the supply voltage $V_{PP}$ is 3.3V, and the pre-stage inverse output signal $S_{AMB0}$ is converted from 1.8V to 0V when the supply voltage $V_{PP}$ is 1.8V. With the aid of the first pre-stage P-type transistor 206 and the second pre-stage P-type transistor 207, when the input signal $S_A$ is converted from the low logic level to the high logic level (0.9V), the pull-up ability of the first pre-stage P-type transistor 206 and the third pre-stage P-type transistor 208 is reduced due to the 0.9V gate voltage of the first pre-stage P-type transistor 206, helping to eliminate the harmful influence of extreme process corners.

Figure 3:
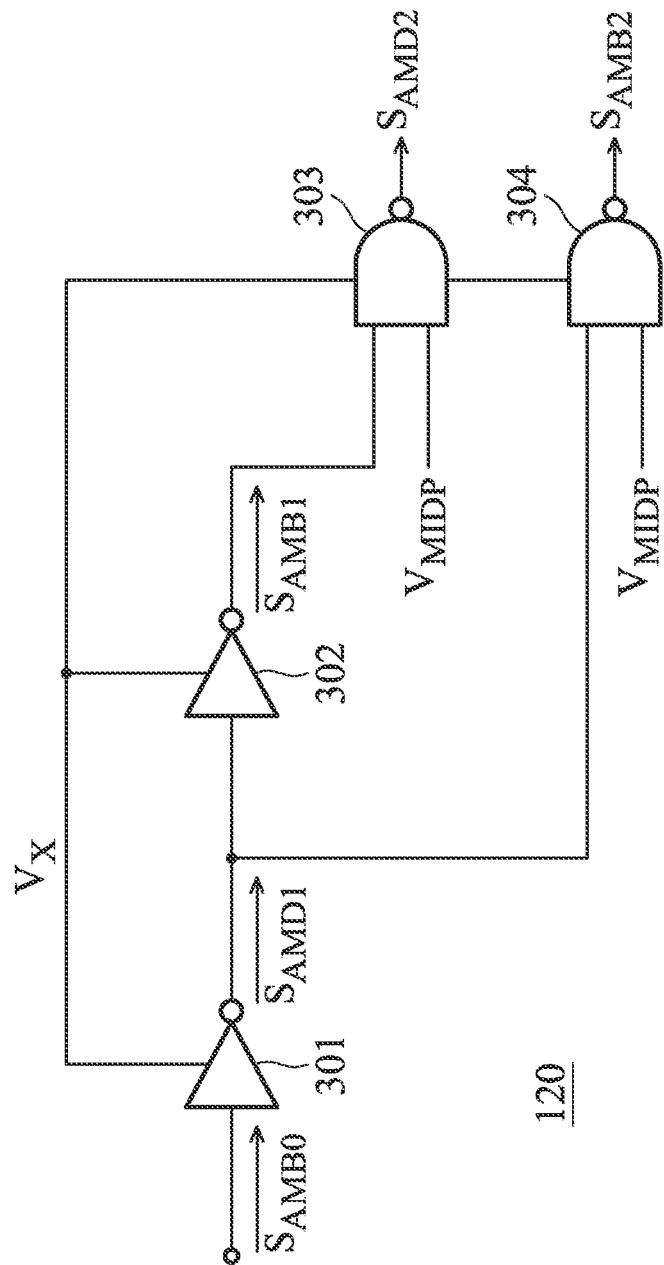
FIG. 3 is a schematic of an embodiment of a logic module.

FIG. 3 is a schematic of an embodiment of a logic module 120. The logic module 120 is coupled between the pre-stage voltage conversion circuit 110 and the post-stage voltage conversion circuit 130, and the logic module 120 receives the pre-stage output signal $S_{AMD0}$ and the inner conversion voltage $V_X$ of the pre-stage voltage conversion circuit 110 to feed the post-stage voltage conversion circuit 130 with the generated signal. As shown in FIG. 3, the inner conversion voltage $V_X$ is applied to the logic module 120, in which the logic module 120 includes the second inverter 301, the third inverter 302, the first NAND gate 303, and the second NAND gate 304. The second inverter 301 receives the pre-stage inverse output signal $S_{AMB0}$ to generate the logic output signal $S_{AMD1}$, and the third inverter 302 receives the logic output signal $S_{AMD1}$ to generate the logic inverse output signal $S_{AMB1}$, such that the pre-stage inverse output signal $S_{AMB0}$ is in-phase with the logic inverse output signal $S_{AMB1}$. According to an embodiment of the invention, due to the long distance between the pre-stage voltage conversion circuit 110 and the post-stage voltage conversion circuit 130, the second inverter 301 and the third inverter 302 are used to prevent the pre-stage inverse output signal $S_{AMB0}$ and the pre-stage output signal $S_{AMD0}$ from distortion caused by the long propagation distance. According to another embodiment of the invention, when the pre-stage voltage conversion circuit 110 is close to the post-stage voltage conversion circuit 130, the logic output signal $S_{AMD1}$ and the logic inverse output signal $S_{AMB1}$ can be replaced by the pre-stage output signal $S_{AMD0}$ and the pre-stage inverse output signal $S_{AMB0}$.

As shown in FIG. 3, the first NAND gate 303 receives the logic output signal $S_{AMD1}$ and the second voltage conversion signal $V_{MIDP}$ to generate the first logic signal $S_{AMD2}$, and the second NAND gate 304 receives the logic inverse output signal $S_{AMD1}$ and the second voltage conversion signal $V_{MIDP}$ to generate the second logic signal $S_{AMB2}$. According to an embodiment of the invention, the inner conversion voltage $V_X$ is 1.45V and the second voltage conversion signal $V_{MIDP}$ is 1.65V when the supply voltage $V_{PP}$ is 3.3V; the inner conversion voltage $V_X$ is 1.8V and the second voltage conversion signal $V_{MIDP}$ is 0V when the supply voltage $V_{PP}$ is 1.8V. Therefore, when the supply voltage $V_{PP}$ is 3.3V, the first NAND gate 303 and the second NAND gate 304 are used as inverters. That is, the first logic signal $S_{AMD2}$ and the second logic signal $S_{AMB2}$ are respectively in-phase and out-phase with the pre-stage output signal $S_{AMD0}$. When the supply voltage $V_{PP}$ is 1.8V, the first logic signal $S_{AMD2}$ and the second logic signal $S_{AMB2}$ are both of the high logic level, that is, 1.45V.

Figure 4:
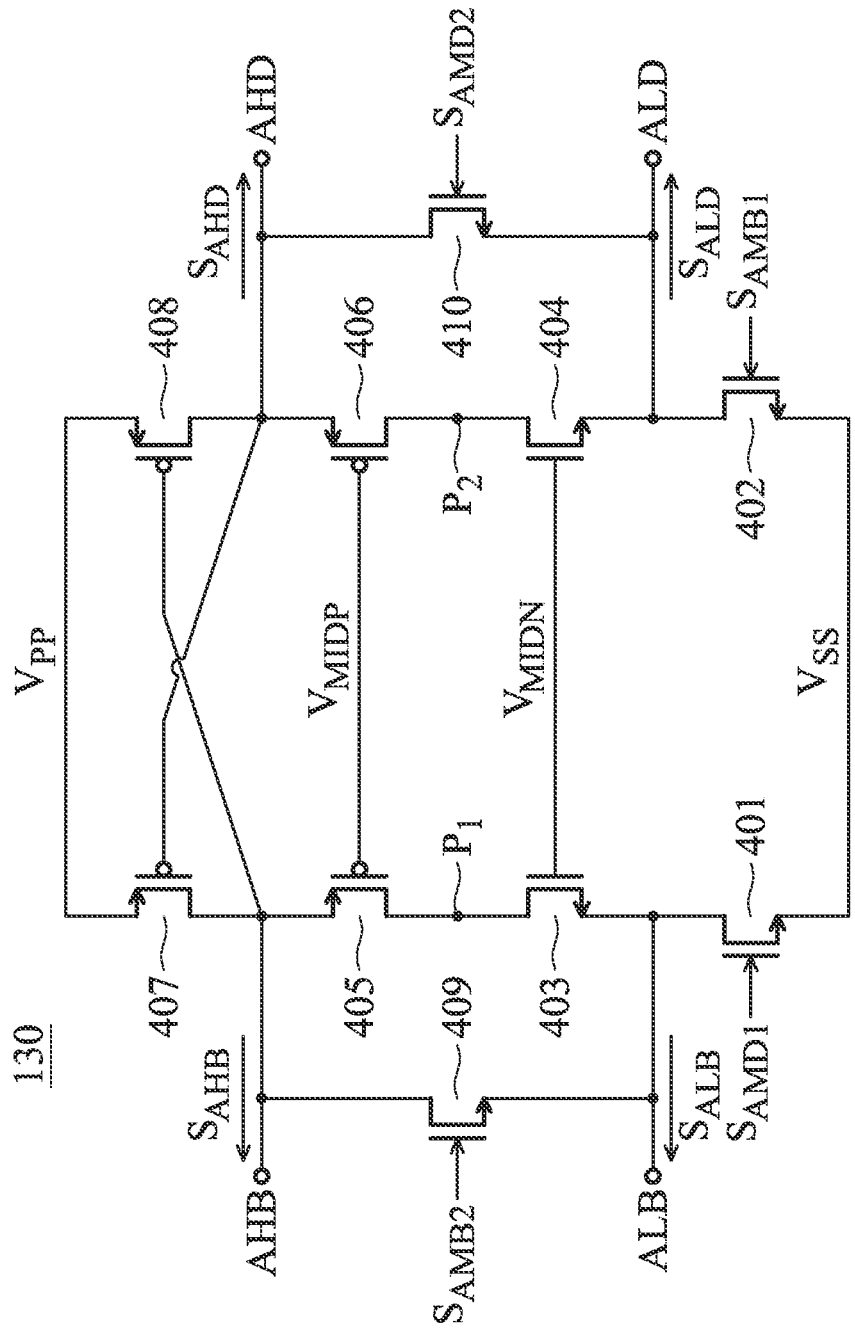
FIG. 4 is a schematic of an embodiment of a post-stage voltage conversion circuit.

FIG. 4 is a schematic of an embodiment of a post-stage voltage conversion circuit 130. The post-stage voltage conversion circuit 130 is coupled to the logic module 120 and receives the output signal of the logic module 120 to generate the final output signal of the voltage conversion circuit provided by the invention. As shown in FIG. 4, the post-stage voltage conversion circuit 130 includes the post-stage first N-type transistor 401, the post-stage second N-type transistor 402, the post-stage third N-type transistor 403, the post-stage fourth N-type transistor 404, the post-stage first P-type transistor 405, the post-stage second P-type transistor 406, the post-stage third P-type transistor 407, the post-stage fourth P-type transistor 408, the post-stage fifth N-type transistor 409, and the post-stage sixth N-type transistor 410.

As shown in FIG. 4, the gate terminal of the post-stage first N-type transistor 401 receives the logic output signal $S_{AMD1}$ of the logic module 120, according to an embodiment of the invention, the logic output signal $S_{AMD1}$ can be replaced by the pre-stage output signal $S_{AMD0}$, the source terminal of the post-stage first N-type transistor 401 is coupled to the ground $V_{SS}$, and the drain terminal of the post-stage first N-type transistor 401 is coupled to the first inverse output terminal ALB which outputs the first inverse output signal $S_{ALB}$. The gate terminal of the post-stage second N-type transistor 402 receives the logic inverse output signal $S_{AMB1}$, according to an embodiment of the invention, the logic inverse output signal $S_{AMB1}$ can be replaced by the pre-stage inverse output signal $S_{AMB0}$ to be the output of the post-stage voltage conversion circuit 130. The source of the post-stage second N-type transistor 402 is coupled to the ground $V_{SS}$, and the drain terminal of the post-stage second N-type transistor 402 is coupled to the first output terminal ALD which outputs the first output signal $S_{ALD}$. The gate terminal of the post-stage third N-type transistor 403 receives the first voltage conversion signal $V_{MIDN}$, the source terminal of the post-stage third N-type transistor 403 is coupled to the first inverse output terminal ALB, and the drain terminal of the post-stage third N-type transistor 403 is coupled to the post-stage first node $P_1$.

The gate terminal of the post-stage fourth N-type transistor 404 receives the first voltage conversion signal $V_{MIDN}$, the source terminal of the post-stage fourth N-type transistor 404 is coupled to the first output terminal ALD, and the drain terminal of the post-stage fourth N-type transistor 404 is coupled to the post-stage second node $P_2$. The gate terminal of the post-stage first P-type transistor 405 receives the second voltage conversion signal $V_{MIDP}$, the source terminal of the post-stage first P-type transistor 405 is coupled to the second inverse output terminal AHB which outputs the second inverse output signal $S_{AHB}$, and the drain terminal of the post-stage first P-type transistor 405 is coupled to the post-stage first node $P_1$. The gate terminal of the post-stage second P-type transistor 406 receives the second voltage conversion signal $V_{MIDP}$, the source terminal of the post-stage second P-type transistor 406 is coupled to the second output terminal AHD which outputs the second output signal $S_{AHD}$, and the drain terminal of the post-stage second P-type transistor 406 is coupled to the post-stage second node $P_2$. The gate terminal of the post-stage third P-type transistor 407 is coupled to the second output terminal AHD, the source terminal of the post-stage third P-type transistor 407 is coupled to the supply voltage $V_{PP}$, and the drain terminal of the post-stage third P-type transistor 407 is coupled to the second inverse output terminal AHB. The gate terminal of the post-stage fourth P-type transistor 408 is coupled to the second inverse output terminal AHB, the source terminal of the post-stage fourth P-type transistor 408 is coupled to the supply voltage $V_{PP}$, and the drain terminal of the post-stage fourth P-type transistor 408 is coupled to the second output terminal AHD.

The gate terminal of the post-stage fifth N-type transistor 409 receives the second logic signal $S_{AMB2}$, the source terminal of the post-stage fifth N-type transistor 409 is coupled to the first inverse output terminal ALB, and the drain terminal of the post-stage fifth N-type transistor 409 is coupled to the second inverse output terminal AHB. The gate terminal of the post-stage sixth N-type transistor 410 receives the first logic signal $S_{AMD2}$, the source terminal of the post-stage sixth N-type transistor 410 is coupled to the first output terminal ALD, and the drain terminal of the post-stage sixth N-type transistor 410 is coupled to the second output terminal AHD.

For the convenience of explanation, it is assumed herein that the threshold voltage of N-type transistors and P-type transistors is 0.2V. According to an embodiment of the invention, when the supply voltage $V_{PP}$ is 3.3V, the first voltage conversion signal $V_{MIDN}$ and the second voltage conversion signal $V_{MIDP}$ are both 1.65V, such that the high logic level of the second inverse output terminal AHB and the second output terminal AHD is 3.3V, and the low logic level is 1.65V adding the threshold voltage of the P-type transistors, that is, 1.85V. The high logic level of the first inverse output terminal ALB and the first output terminal ALD is the threshold voltage of the N-type transistor subtracted from 1.65V, i.e. 1.45V, and the low logic level is 0V. Although the supply voltage $V_{PP}$ is 3.3V which exceeds the punch-through voltage of all transistors that is 2.4V, the stress of all transistors are kept under the punch-through voltage and protected from breakdown due to the post-stage third N-type transistor 403, the post-stage fourth N-type transistor 404, the post-stage first P-type transistor 405, the post-stage second P-type transistor 406, the first voltage conversion signal $V_{MIDN}$, and the second voltage conversion signal $V_{MIDP}$.

The voltage conversion circuit provided by the invention is compatible with multiple supply voltages. In the embodiments above, the supply voltage is higher than the punch-through voltage of the transistors, and in the following embodiments, the supply voltage is lower than the punch-through voltage of the transistors. When the supply voltage $V_{PP}$ is 1.8V, the post-stage fifth N-type transistor 409 and the post-stage sixth N-type transistor 410 short the first inverse output terminal ALB and the second inverse output terminal AHB, and the first output terminal ALD and the second output terminal AHD, according to the second logic signal $S_{AMB2}$ and first logic signal $S_{AMD2}$ respectively, such that the high logic level of the first inverse output terminal ALB, the first output terminal ALD, the second inverse output terminal AHB, and the second output terminal AHD is 1.8V and the low logic level is 0V. Without reducing the voltage level of the signals, the driving capability of the circuit is significantly improved while driving the transistors of the subsequent circuits. In addition, after the post-stage third N-type transistor 403, the post-stage fourth N-type transistor 404, the post-stage first P-type transistor 405, and the post-stage second P-type transistor 406 are shorted, the operation speed is significantly improved due to there being fewer transistors in series in the circuit.

For clearly explaining the operation of the circuit provided in the invention, the following description will combine FIGS. 1-4 for more detail and overall explanation. According to an embodiment of the invention, the supply voltage $V_{PP}$ is switching between 1.8V and 3.3V. The high logic level of the input signal $S_A$ is 0.9V, the absolute value of the threshold voltage of N-type transistors and P-type transistors is 0.2V, and the punch-through voltage of all transistors is 2.4V. The following description of the circuit provided by the invention is according to an embodiment.

When the supply voltage $V_{PP}$ is 3.3V, the first voltage conversion signal $V_{MIDN}$ of the first voltage protection module 111 in FIG. 2 is 1.65V, half of the supply voltage $V_{PP}$, and the voltage selection signal $V_{SELH}$ is 3.3V, such that the inner conversion voltage $V_X$ is limited to 1.45V which is the threshold voltage of N-type transistors subtracted from the first voltage conversion signal $V_{MIDN}$. Therefore, the first voltage conversion module 112 converts the input signal $S_A$ with the high logic level of 0.9V into the pre-stage inverse output signal $S_{AMB0}$ and the pre-stage output signal $S_{AMB0}$ with the high logic level of 1.45V. The main purpose of first pre-stage P-type transistor 206 and the second pre-stage P-type transistor 207 of the first voltage conversion module 112 is to release the stress of the lack of pull-down ability of the first pre-stage N-type transistor 204 and the second pre-stage N-type transistor 205, such that the width-to-length ratio (W/L) of the first pre-stage N-type transistor 204 and the second pre-stage N-type transistor 205 is not too great.

When the supply voltage $V_{PP}$ is 3.3V, the inner conversion voltage $V_X$, 1.45V is applied to the logic module 120 of FIG. 3, and the logic module 120 converts the first logic signal $S_{AMD2}$ and the second logic signal $S_{AMB2}$ into being in-phase and out-phase with the pre-stage output signal $S_{AMD0}$ respectively. The second inverter 301 and the third inverter 302 are used to prevent the pre-stage output signal $S_{AMD0}$ and the pre-stage inverse output signal $S_{AMB0}$ from distortion during signal propagation.

Then, the first logic signal $S_{AMD2}$, the second logic signal $S_{AMB2}$, the logic output signal $S_{AMD1}$, and the logic output inverse signal $S_{AMB1}$ are transferred to the post-stage voltage conversion circuit 130 of FIG. 4 with the supply voltage $V_{PP}$ being 3.3V. The first voltage conversion signal $V_{MIDN}$ is 1.65V, which limits the voltages of the first inverse output terminal ALB and the first output terminal ALD not greater than 1.45V, that is, the threshold voltage of the post-stage third N-type transistor 403 or the post-stage second P-type transistor 406 is subtracted from the first voltage conversion signal $V_{MIDN}$. The second voltage conversion signal $V_{MIDP}$ is also 1.65V, which limits the voltages of the second inverse output terminal AHB and the second output terminal AHD to no less than 1.85V. That is, the second voltage conversion signal $V_{MIDP}$ is added to the absolute value of the threshold voltage of the post-stage first P-type transistor 405 or the post-stage second P-type transistor 406.

When the supply voltage $V_{PP}$ is 1.8V, the voltage selection signal $V_{SELH}$ of FIG. 2 is 0V, such that the inner conversion voltage $V_X$ is 1.8V, and the first voltage conversion module 112 thus converts the high logic level of the input signal $S_A$, e.g. 0.9V into the pre-stage inverse output signal $S_{AMB0}$ and the pre-stage output signal $S_{AMD0}$ with the high logic level being 1.8V. In addition, the logic module 120 of FIG. 3 generates the first logic signal $S_{AMD2}$ and the second logic signal $S_{AMB2}$ which are in the high logic level that is 1.8V, according to the second voltage conversion signal $V_{MIDP}$ being 0V, to turn on the post-stage fifth N-type transistor 409 and the post-stage sixth N-type transistor 410 of FIG. 4.

Due to there being four transistors in series between the supply voltage $V_{PP}$ and the ground $V_{SS}$, the operation speed is slower when the supply voltage $V_{PP}$ is lower, such that the circuit can be used in applications that require higher transmission speeds. Therefore, the number of transistors in series is reduced after turning on the post-stage fifth N-type transistor 409 and the post-stage sixth N-type transistor 410. That is, the post-stage third N-type transistor 403, the post-stage fourth N-type transistor 404, the post-stage first P-type transistor 405, and the post-stage second P-type transistor 406 are shorted. Due to the reduction of the number of transistors in series, the speed is significantly improved. Moreover, the voltage swing of the first output signal $S_{ALD}$, the first inverse output signal $S_{ALB}$, the second output signal $S_{AHD}$, and the second inverse output signal $S_{AHB}$ is fully preserved without punching through the transistors. That is, the high logic level is 1.8V, and the low logic level is 0V, and the driving capability of the level-shift circuit to drive the transistors of the subsequent circuits is improved.

The voltage of each significant signal at different supply voltage $V_{PP}$ is listed in Table 1.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

TABLE 1

| $V_{PP}$ | 3.3 V | 1.8 V |
|---|---|---|
| $V_{SELH}$ | $V_{PP}$ | 0 |
| $V_{MIDN}$ | $V_{PP}/2$ | $V_{PP}$ |
| $V_{MIDP}$ | $V_{PP}/2$ | 0 |
| $S_{AMD0}$, $S_{AMB0}$ | $0 \sim V_{PP}/2 - V_{THN}$ | $0 \sim V_{PP}$ |
| $S_{ALD}$, $S_{ALB}$ | $0 \sim V_{PP}/2 - V_{THN}$ | $0 \sim V_{PP}$ |
| $S_{AHD}$, $S_{AHB}$ | $V_{PP}/2 + |\sim V_{THP}|V_{PP}$ | $0 \sim V_{PP}$ |

What is claimed is:

1. A level-shift circuit, receiving a supply voltage and an input signal to generate a first inverse output signal, a first output signal, a second inverse output signal and a second output signal, the level-shift circuit comprises:
   a pre-stage voltage conversion circuit, comprising:
   a first voltage protection module, coupled to the supply voltage and converting the supply voltage into an inner conversion voltage; and
   a first voltage conversion module, coupled to the first voltage protection module, receiving the input signal, and converting the input signal into a pre-stage output signal according to the inner conversion voltage, wherein a high logic level of the pre-stage output signal is equal to the inner conversion voltage; and
   a post-stage voltage conversion circuit, coupled to the pre-stage voltage conversion circuit, wherein the post-stage voltage conversion circuit receives the pre-stage output signal to generate the first inverse output signal, the first output signal, the second inverse output signal and the second output signal, the post-stage voltage conversion circuit comprising:
   a second voltage protection module, generating the first inverse output signal, the first output signal, the second inverse output signal, and the second output signal;
   an N-type input pair, comprising a plurality of first N-type transistors, wherein source terminals of the first N-type transistors are coupled to a ground, one of gate terminals of the first N-type transistors receives the pre-stage output signal and the other gate terminal of the first N-type transistors receives an inverse of the pre-stage output signal, and one of drain terminals of the first N-type transistors receives the first inverse output signal and the other drain terminal of the first N-type transistors receives the first output signal; and
   a P-type cross-coupled pair, comprising a plurality of first P-type transistors, wherein source terminals of the first P-type transistors are coupled to the supply voltage, one of drain terminals of the first P-type transistors receives the second inverse output signal and the other drain terminal of the first P-type transistors receives the second output signal,
   wherein the pre-stage voltage conversion circuit and the post-stage voltage conversion circuit comprise a plurality of transistors with a punch-through voltage, wherein the level-shift circuit makes stress of the transistors less than the punch-through voltage when the supply voltage is greater than the punch-through voltage, and the level-shift circuit outputs the first inverse output signal, the first output signal, the second inverse output signal, and the second output signal with a voltage swing equal to the supply voltage when the supply voltage is less than the punch-through voltage.

2. The level-shift circuit of claim 1, wherein the second voltage protection module further comprises:
   a first N-type transistor pair, comprising a plurality of second N-type transistors, wherein one of source terminals of the second N-type transistors receives the first inverse output signal and the other source terminal of the second N-type transistors receives the first output signal, gate terminals of the second N-type transistors receive a first voltage conversion signal;
   a first P-type transistor pair, comprising a plurality of second P-type transistors, wherein one of source terminals of the second P-type transistors receives the second inverse output signal and the other source terminal of the second P-type transistors receives the second output signal, gate terminals of the second P-type transistors receive a second voltage conversion signal, drain terminals of the second P-type transistors are respectively coupled to the drain terminals of the second N-type transistors;
   a third N-type transistor, wherein a source terminal of the third N-type transistor receives the first inverse output signal, a drain terminal of the third N-type transistor receives the second inverse output signal, and a gate terminal of the third N-type transistor receives a second logic signal; and
   a fourth N-type transistor, wherein a source terminal of the fourth N-type transistor receives the first output signal, a drain terminal of the fourth N-type transistor receives the second output signal, and a gate terminal of the fourth N-type transistor receives a first logic signal.

3. The level-shift circuit of claim 2, wherein a voltage of the second voltage conversion signal is half of a voltage of a first supply voltage when the supply voltage is the first supply voltage, and the second voltage conversion signal is a ground level when the supply voltage is a second supply voltage.

4. The level-shift circuit of claim 2, wherein
   when the supply voltage is a first supply voltage, a voltage of the first voltage conversion signal and the second voltage conversion signal is half of a voltage of the first supply voltage, and
   when the supply voltage is a second supply voltage, the third N-type transistor and the fourth N-type transistor short the first N-type transistor pair and the first P-type transistor pair, according to the second logic signal and the first logic signal respectively, such that a voltage difference of the second inverse output signal and the second output signal is the second supply voltage,
   wherein the first supply voltage is greater than the punch-through voltage and the second supply voltage is less than the punch-through voltage.

5. The level-shift circuit of claim 4, wherein when the supply voltage is the first supply voltage, a variation range of the second output signal and the second inverse output signal is between the first supply voltage and half of the first supply voltage, and a variation range of the first output signal and the first inverse output signal is between half of the first supply voltage and a ground level.

6. The level-shift circuit of claim 4, wherein the first voltage protection module comprises:
   a fifth N-type transistor, wherein a source terminal of the fifth N-type transistor is coupled to the inner conversion voltage, a drain of the fifth N-type transistor is coupled to the supply voltage, and a gate terminal of the fifth N-type transistor receives the first voltage conversion signal; and
   a third P-type transistor, wherein a source terminal of the third P-type transistor is coupled to the supply voltage, a drain terminal of the third P-type transistor is coupled to the inner conversion voltage, and a gate terminal of the third P-type transistor receives a voltage selection signal, wherein
   when the supply voltage is the first supply voltage, the voltage of the first voltage conversion signal is half of the voltage of the first supply voltage, and the voltage selection signal is the first supply voltage, and
   when the supply voltage is the second supply voltage, the voltage of the first voltage conversion signal is the second supply voltage, and the voltage selection signal is a ground level.

7. The level-shift circuit of claim 6, wherein the first voltage conversion module comprises:
   a sixth N-type transistor, wherein a gate terminal of the sixth N-type transistor receives the input signal, a source terminal of the sixth N-type transistor is coupled to the ground, and a drain terminal of the sixth N-type transistor is coupled to the inverse of the pre-stage output signal;
   a seventh N-type transistor, wherein a gate terminal of the seventh N-type transistor receives the inverse of the input signal, a source terminal of the seventh N-type transistor is coupled to the ground, and a drain terminal of the seventh N-type transistor is coupled to the pre-stage output signal;
   a fourth P-type transistor, wherein a gate terminal of the fourth P-type transistor receives the input signal, a source terminal of the fourth P-type transistor is coupled to a first node, and a drain terminal is coupled to the inverse of the pre-stage output signal;
   a fifth P-type transistor, wherein a gate terminal of the fifth P-type transistor receives the inverse of the input signal, a source terminal of the fifth P-type transistor is coupled to a second node, and a drain terminal of the fifth P-type transistor receives the pre-stage output signal;
   a sixth P-type transistor, wherein a gate terminal of the sixth P-type transistor is coupled to the second node, a source terminal of the sixth P-type transistor is coupled to the inner conversion voltage, and a drain terminal of the sixth P-type transistor is coupled to the first node; and
   a seventh P-type transistor, wherein a gate terminal of the seventh P-type transistor is coupled to the first node, a source terminal of the seventh P-type transistor is coupled to the inner conversion voltage, and a drain terminal of the seventh P-type transistor is coupled to the second node.

8. The level-shift circuit of claim 2, further comprising:
   a logic module, coupled to the pre-stage voltage conversion circuit and the post-stage voltage conversion circuit, wherein the inner conversion voltage and the pre-stage output signal are applied to the logic module which generates a first logic signal and a second logic signal according to the pre-stage output signal, and the first logic signal and the second logic signal are applied to the second voltage protection module.

9. The level-shift circuit of claim 8, wherein
   when the supply voltage is the first supply voltage, the first logic signal generated by the logic module is the pre-stage output signal, and the second logic signal generated by the logic module is the inverse of the pre-stage output signal; and
   when the supply voltage is the second supply voltage, the first logic signal and the second logic signal generated by the logic module are the second supply voltage.

* * * * *